United States Patent [19]

Quazi

[11] Patent Number: 4,693,805
[45] Date of Patent: Sep. 15, 1987

[54] METHOD AND APPARATUS FOR SPUTTERING A DIELECTRIC TARGET OR FOR REACTIVE SPUTTERING

[75] Inventor: Fazle S. Quazi, Boulder, Colo.

[73] Assignee: BOE Limited, San Francisco, Calif.

[21] Appl. No.: 829,190

[22] Filed: Feb. 14, 1986

[51] Int. Cl.⁴ .............................................. C23C 14/34
[52] U.S. Cl. ................................ 204/192.22; 204/298
[58] Field of Search ............ 204/192 R, 192 D, 192 F, 204/298, 192.22, 192.13, 192.12, 192.23

[56] References Cited

U.S. PATENT DOCUMENTS

| | | | |
|---|---|---|---|
| 3,464,907 | 9/1969 | Froemel et al. | 204/192 R |
| 3,525,680 | 8/1970 | Davidse et al. | 204/298 X |
| 3,594,295 | 7/1971 | Meckel et al. | 204/192 R |
| 3,617,459 | 11/1971 | Logan | 204/192 D |
| 3,763,031 | 10/1973 | Scow et al. | 204/298 |
| 4,021,277 | 5/1977 | Shirn et al. | 204/298 X |
| 4,046,659 | 9/1977 | Cormia et al. | 204/192 C |
| 4,131,533 | 12/1978 | Bialks et al. | 204/298 |
| 4,464,223 | 8/1984 | Gorin | 204/298 X |
| 4,579,618 | 4/1986 | Celestino et al. | 204/298 X |
| 4,585,516 | 4/1986 | Corn et al. | 204/298 X |

Primary Examiner—John F. Niebling
Assistant Examiner—Nam X. Nguyen
Attorney, Agent, or Firm—Gerald J. Ferguson, Jr.; Michael P. Hoffman; Ronni S. Malamud

[57] ABSTRACT

A device and method for sputtering dielectric targets, for reactive sputtering, and for sputter etching, including a target, anode and auxiliary electrode where each of the foregoing elements is electrically isolated from a grounded chamber containing a plasma and during a sputtering cycle, the anode and target are connected across a first floating power supply which applies a first series of waveforms to the target to render the target positive with respect to the plasma and thus sputter it and during a charge removal cycle, the auxiliary electrode and target are connected across a second floating power supply which applies to the target a second series of waveforms during respective intervals between the first series of waveforms to render the target negative with respect to the plasma and thus remove any positive charge build up which may have occurred during the sputtering cycle.

24 Claims, 10 Drawing Figures

METHOD AND APPARATUS FOR SPUTTERING A DIELECTRIC TARGET OR FOR REACTIVE SPUTTERING

FIELD OF THE INVENTION

This invention relates to sputtering devices and methods and, in particular, to such devices and methods for sputtering dielectric targets or for reactive sputtering.

BACKGROUND OF THE INVENTION

The word "sputtering" is used to describe the process in which a cathode (target) is subject to ion bombardment in a vacuum plasma.

Sputtering is one of the most convenient and economical ways to deposit thin films on a substrate. The rate of deposition is comparable to other deposition techniques. Flexibilities in terms of controlling the process parameters, which determine the quality of the deposited film, are excellent. In addition, sputtering techniques also can be used to sputter-etch, for example, etching of wafers before metalization.

The simplest type of sputtering device is composed of a vacuum chamber with an anode-cathode assembly, in which, the chamber is pumped down to a very low pressure. Then, a pure gas, most commonly argon, is introduced into the system. Finally, a high voltage is applied across the anode and cathode of the system. Upon application of that high field, the gas breaks down and a glow discharge begins. The most important region in a glow discharge is the cathode fall region. In this area, bombarding ions are produced by electron-neutral gas molecule collisions. On the other hand, secondary electrons are emitted due to the bombardment of the target (cathode) surface by the gas ions; thus, the sputtering process continues. In the case of DC sputtering, a grounded metallic chamber also is used as the anode of the system.

The DC sputtering process can be used only to sputter and etch conductive materials. Because DC cannot pass through an insulating material, a radio frequency (RF) source is used to sputter and etch insulators. The industrially allocated frequency for this purpose is 13.56 MHz. In the case of RF sputtering, the source (RF generator) is connected across the target and grounded vacuum chamber through a matching network, as shown in FIG. 1(A). Upon application of the RF field, a glow discharge can be initiated. Then, during the negative half cycle of the field at the target, ions are attracted toward the target, causing sputtering. However, these bombarding ions are also responsible for the emission of electrons from the target surface. As a result, the insulating target material becomes positively charged. This charge is neutralized during the next cycle when the target becomes positive and attracts electrons from the glow discharge.

Although an RF glow discharge is initially produced by using a symmetrical sinusoidal output of the RF generator, in an assymmetrical sputtering system there appears a negative self-bias at the target. This can be explained as follows: due to the alternating characteristics of the RF field, the RF voltage cannot recognize which electrode is anode and which electrode is cathode. However, if the target surface area is much smaller compared to the chamber surface area, then this asymmetry between the surface area of the two electrodes forces the glow discharge to establish a negative self-bias at the target with respect to the ground, or, more precisely, with respect to the plasma potential. This is shown in FIGS. 2(A) and 2(B).

The establishment of negative self-bias or DC offset at the target is very important in an RF excited sputtering process because this self-bias determines the energy of the bombarding ions. Thus, DC offset can be considered as a counterpart of cathode fall voltage in the case of DC sputtering. The relationship between the amount of negative self-bias and the area ratio of the two electrodes is not exactly known although it is known the smaller the size of the targer the higher the DC offset.

An equivalent electrical circuit representing an RF glow discharge system is shown in FIG. 1(B) where the following is a description of the circuit components:

(1) $C_p$ and $L_p$: Plasma capacitance and inductance
(2) $C_{st}$: space charge sheath - target capacitance
(3) $C_{sw}$: space charge sheath - chamber wall capacitance
(4) $R_s = R_{st} + R_p + R_{sw}$ = resistive part of the system
(5) $C_{tw}$: fixed capacitance due to target mounting on the wall
(6) $C_d$: distributed or stray capacitance Values of the different circuit components (except $C_{tw}$ and $C_d$) primarily depend on target and vacuum chamber size, target material, argon gas pressure, RF power and external magnetic field.

The characteristics of an RF sputtering system can be summarized as follows:

(a) DC offset at the target is established in an asymmetrical RF excited sputtering system. The amount of this DC offset determines bombarding ion energy and so the sputtering rate.

(b) RF glow discharge impedance is mostly due to its capacitance.

(c) Capacitance due to target amount and stray field act in parallel to the glow discharge impedance. Since they are acting in parallel, the sputtering system impedance due to its reactive part cannot be higher than the impedance due to external (target mount and distributed) capacitance. Furthermore, this external capacitance often contributes a much lower impedance compared to the glow discharge impedance and, thus, a significant amount of RF power is wasted.

The area ratio problem in an RF sputtering system is unavoidable due to the physical nature of the RF excited glow discharge. This prevents achieving high sputtering yields from a large target. Table 1 below shows how poor the existing RF sputtering process is when compared to DC sputtering

TABLE I

SYSTEM DESCRIPTION

Magnetically enhanced sputtering
Target size = 5" × 15" = 75 square inches
Power = 67 watts/sq. inch
Vacuum chamber size 2' dia × 2' high

| Power Source | Target | Sputtering Rate Angstroms/min |
|---|---|---|
| DC | Cu | 12,000 |
| DC | Al | 6,000 |
| RF | $Al_2O_3$ | 300 |
| RF | $SiO_2$ | 700 |

Source: Vac-Tec Systems, Inc., Boulder, Colorado; SCP and Solid State Technology, December 1966, pp. 31–36; and applicant's own experience.

In order to increase the sputtering rate it is necessary to produce a sufficiently high negative self bias or DC offset at the target. For example, if there exists a 500 V DC offset at the target, the ions may accelerate and bombard the target with 500 eV energy. The results of sputtering of various targets using 500 eV ions are shown in Table II below. These ions were produced from an ion beam source.

TABLE II

| | Ion Energy = 500 eV |
|---|---|
| Target | Sputtering Rate. Angstroms/min |
| Cu | 870 |
| Al$_2$O$_3$ | 129 |
| SiO$_2$ | 400 |

Source: Ion Tech. Inc., Fort Collins, Colorado.

In Table I, for example, the sputtering ratio of Al$_2$O$_3$ to Cu is 300/12,000=0.025. However, in comparison, this same ratio using the data from Table II, i.e., 129/870=0.148, is 6 times higher than the previous ratio. This comparison also indicates that in an RF excited glow discharge, if one is able to increase the bombarding ion energy to 500 eV then the sputtering rate should increase six times while using a large target.

In the case of DC reactive sputtering, wherein a metallic target is sputtered in a partial atmosphere of a gas such as O$_2$, the oxide of the metal of the target tends to build up on the target. Since this oxide is typically non-conductive, the problems of target arcing become severe.

As can be appreciated from the foregoing a method and apparatus is needed for sputtering dielectric materials or for reactive sputtering wherein the sputtering rate is substantially increased with respect to conventional RF sputtering.

A number of techniques, other than conventional RF sputtering are described in the prior art for sputtering dielectrics or for reactive sputtering and have met with varying degrees of success. Some of these are as follows.

In U.S. Pat. No. 3,594,295 (copy submitted herewith) an RF sputtering apparatus is disclosed for sputtering dielectric materials wherein potentials of opposite polarity are applied to the target, the potentials being alternated at radio frequencies. Thus, one-half of the target is negative and thus sputtered while the other half of the target is positive and repels positive ions. Ion bombardment during this interval of sputtering deposits a positive charge on the negative one-half of the non-conducting target that is sputtered. In order that this positive charge does not subsequently repel and inhibit further sputtering, the opposite electrode that was previously sputtered is positive and attracts electrons sputtered from the other half of the target. This effectively neutralizes the positive charge acquired previously.

U.S. Pat. No. 3,464,907 (copy submitted herewith) is directed to a triode sputtering device wherein the first pulse generator 40,24 applies pulses across an anode 21 and a cathode filament 20 to thus establish plasma within the chamber. A second pulse generator 40,54 applies pulses between the target 27 and an anode 21 to render the target negative with respect to the anode to thus effect sputtering of the target, the sputtered material being deposited on a substrate 35. The apparatus is usable with either metallic, insulative or targets made of other materials.

U.S. Pat. No. 4,131,533 (copy submitted herewith) discloses enhancement of the resputtering rate in RF sputtering apparatus where the anode shield is isolated from ground potential.

U.S. Pat. No. 4,046,659 (copy submitted herewith) discloses a method of reducing arc formation in a reactive, magnetron sputtering system where an AC potential is applied between the anode and cathode.

OBJECTS OF THE INVENTION

A primary object of the invention is to provide a process and method for sputtering dielectric materials or for reactive sputtering wherein the sputtering rate is substantially increased with respect to conventional RF sputtering.

Other objects and advantages of this invention will be apparent from a reading of the following specification and claims taken with the drawing.

DETAILED DESCRIPTION OF PREFERRED EMBODIMENTS OF THE INVENTION

Figure 1A:
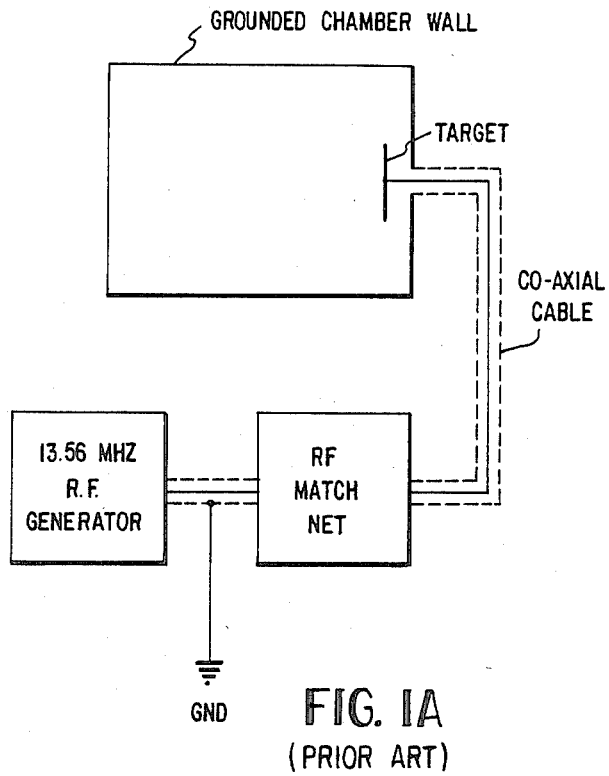
FIG. 1(A) shows a known RF sputtering system in which an RF generator is connected across the target and a grounded vacuum chamber through a matching network.
Figure 1B:
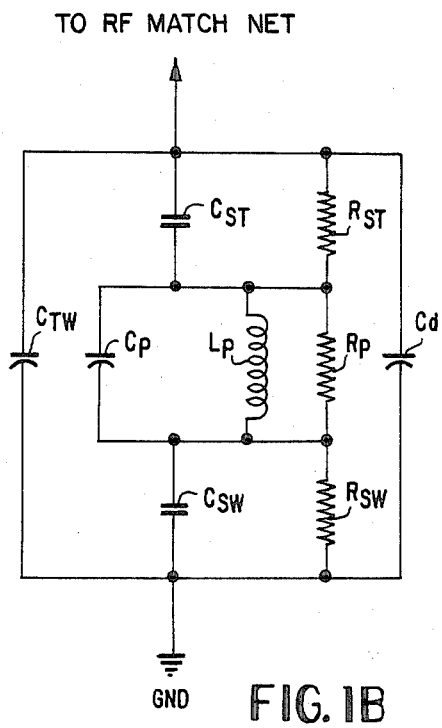
FIG. 1(B) is an equivalent electrical circuit of the RF sputtering system of FIG. 1(A).
Figure 2A:
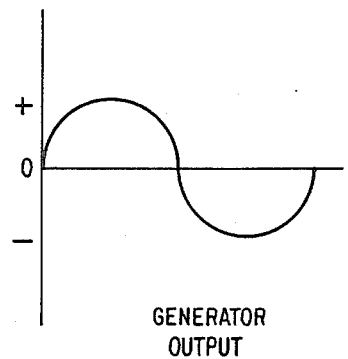
FIGS. 2(A) and 2(B) are graphs illustrative of the situation where the target surface area is much smaller compared to the chamber surface area, whereby this asymmetry between the surface area of the two electrodes forces the glow discharge to establish a negative self-bias at the target with respect to the ground or more precisely, with respect to the plasma potential.
Figure 2B:
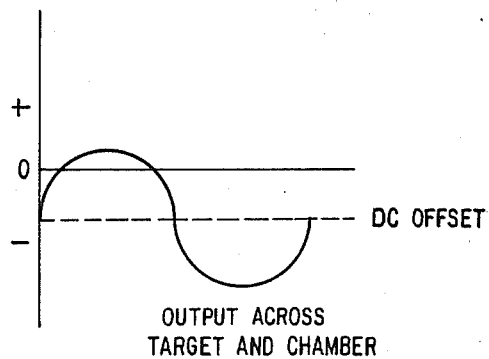
Figure 3:
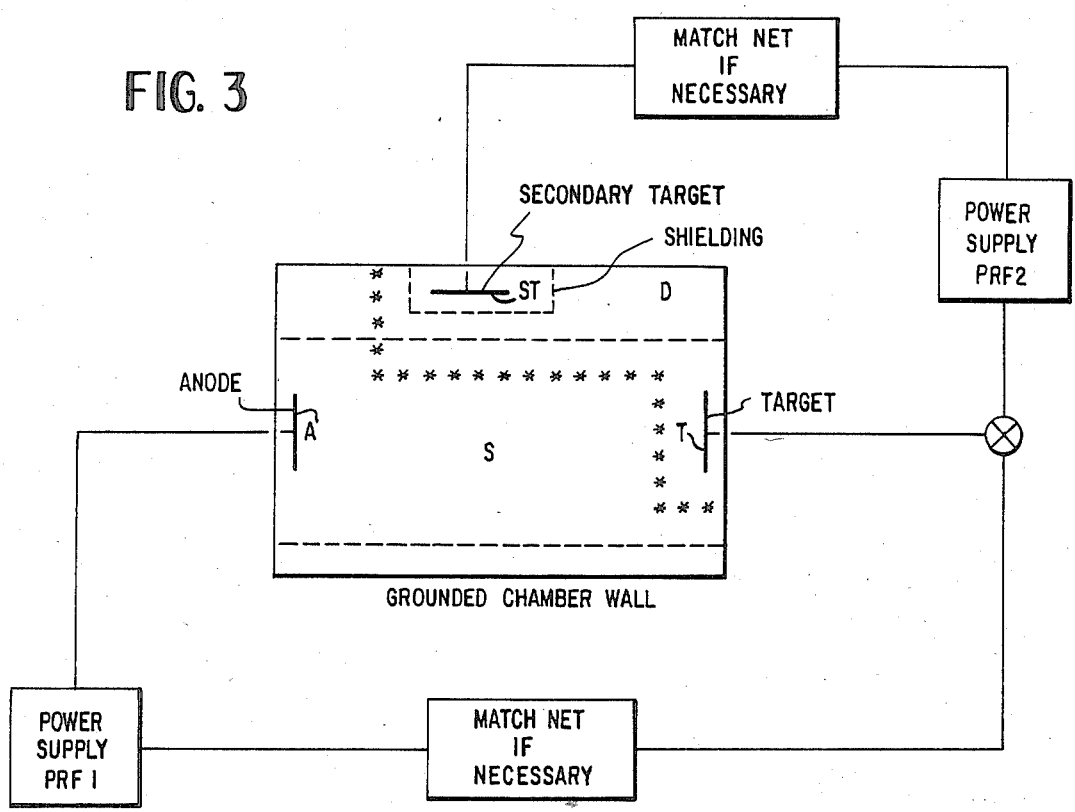
FIG. 3 is an illustrative embodiment of a sputtering system in accordance with the present invention.

An illustrative embodiment of the novel sputtering system of the present invention is shown in FIG. 3. The system includes a chamber, the wall of which is grounded or at some other reference potential. Disposed within the chamber is a target T of dielectric material to be sputtered, the target being typically mounted on a conductive electrode in a conventional manner with the exception the target and its mounting electrode float (are electrically isolated) with respect to the grounded chamber. Also disposed within the chamber are an anode A and a secondary target (or auxiliary electrode) ST. The anode and auxiliary electrode are also floated with respect to ground in accordance with a primary aspect of the invention. Moreover, connected across the anode A and target T is a first floating power supply PRF1 and connected across the auxiliary electrode ST and the target R is a second floating power supply PRF2 to insure the electrode isolation of the anode, target and auxiliary electrode with respect to the grounded chamber wall. Impedance matching networks, if necessary, may also be employed as indicated in FIG. 3.

Shielding may optionally be employed for the auxiliary electrode ST as indicated by the dotted lines in F. Typically the shielding comprises a thin sheet of aluminum or stainless steel spaced about one or two inches away from the auxiliary electrode, the purpose of the sheet being to prevent contamination of the substrates or target with the material of the auxiliary electrode due to sputtering thereof. Thus, if any sputtering of the auxiliary electrode occurs it will deposit on the sheet which is mounted with respect to the chamber and at the same potential. The size of the sheet should be sufficient to collect any material sputtered by the auxiliary electrode. The space between the shield and the chamber is open and a potential can be established between the auxiliary electrode and the target upon energization of PRF2.

With respect to the auxiliary electrode, it is made of any typical metallic material used as a cathode in such systems. Moreover, it is out of the line-of-sight between the anode (or substrates) and target where the substrates may be mounted anywhere in the chamber including on the anode or on the chamber walls, the substrate(s) not being shown in the drawing.

The overall system for the purpose of describing the operation thereof may be divided into two blocks. The first block S, which corresponds to the sputtering cycle, is indicated by dotted lines. The second block D which is indicated by stars corresponds to a positive charge removing cycle.

Figure 7:
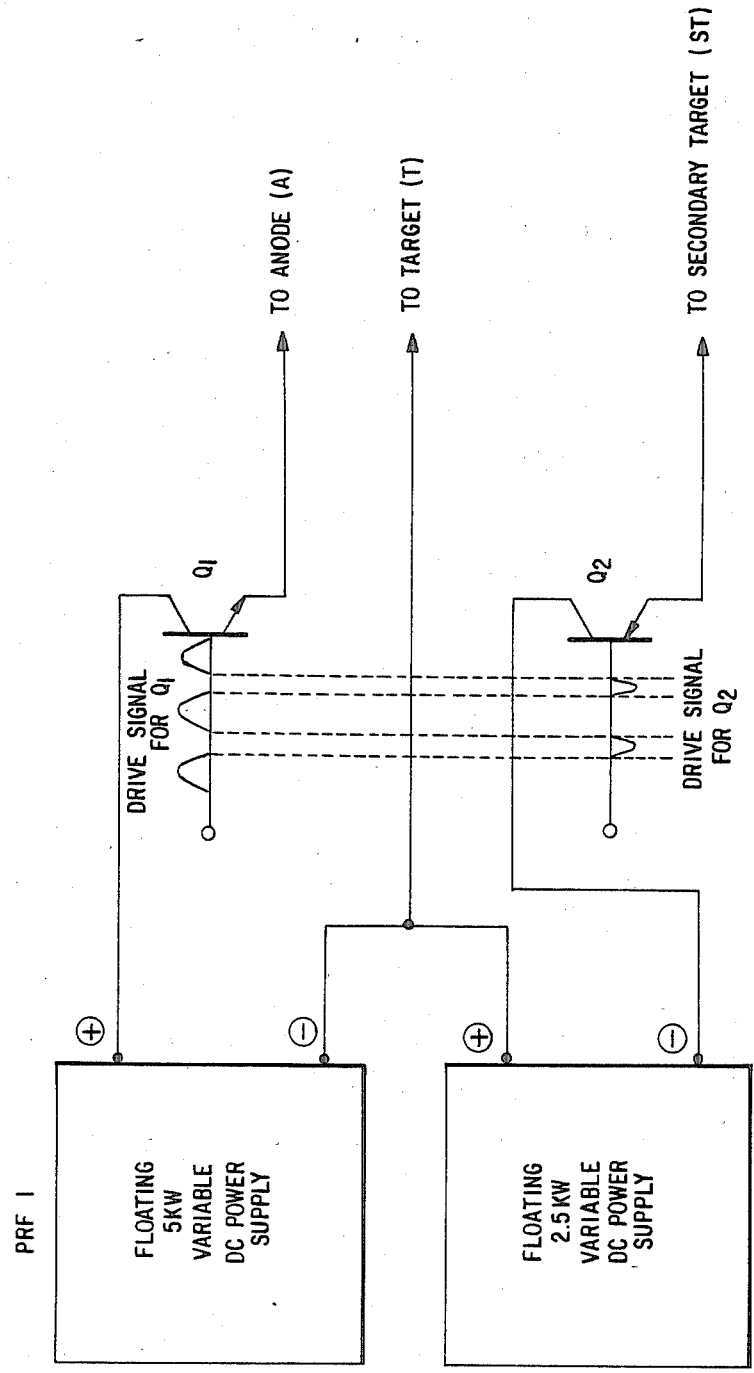
FIG. 7 shows a floating type of power supply as may be employed in the present invention.

The sputtering cycle block S will be described first. In S, for a brief period of time, high voltage is applied across the target T and the anode A. The power source PRF1 which provides the discharge current and voltage is preferably a floating type of power supply as shown in FIG. 7.

Figure 4A:
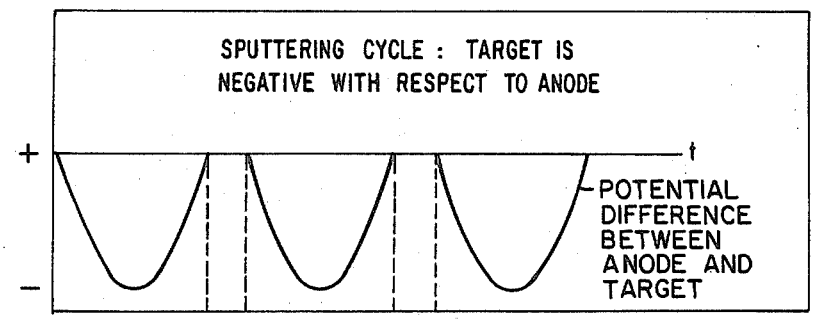
FIG. 4(A) shows a waveform which may be used in the present invention during the sputtering cycle thereof.

The generator in the present invention typically produces a 13.56 MHz output and its waveform may have the shape as shown in FIG. 4A. The duty cycle of the generator can be made to vary. This generator is denoted as a pulsating RF (PRF1) generator. By applying the output of PRF1 across T and A through a matching network a glow discharge can be initiated and as a result ions will begin to bombard T. Positive charge will begin to accumulate on the surface of T and this charge must be removed before the next sputtering cycle begins.

In the present invention the sputtering cycle closely resembles the DC sputtering process due to the electrical isolation of T and A with respect to the grounded chamber wall and, thus, the concept of DC offset in this situation is meaningless. However, as in DC, in the present invention it is possible to establish any potential difference between T and A, indicating that bombarding ion energy may increase as desired.

Figure 4B:
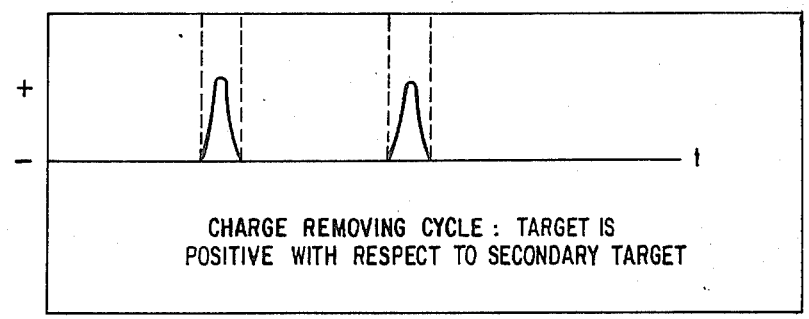
FIG. 4(B) which shows a waveform which may be used in the present invention during the charge removal cycle thereof.

Similarly to PRF1, a power generator PRF2 is used to remove charge from the target by making the target positive with respect to a secondary target. However, the duty cycle of PRF2 is preferably much shorter, compared to PRF1, as shown in FIG. 4B. This is due to the fact that electron mobility is much higher than ion mobility. By making the target positive for a brief period of time, enough electrons can be attracted from the glow discharge to neutralize the target surface.

Figure 5:
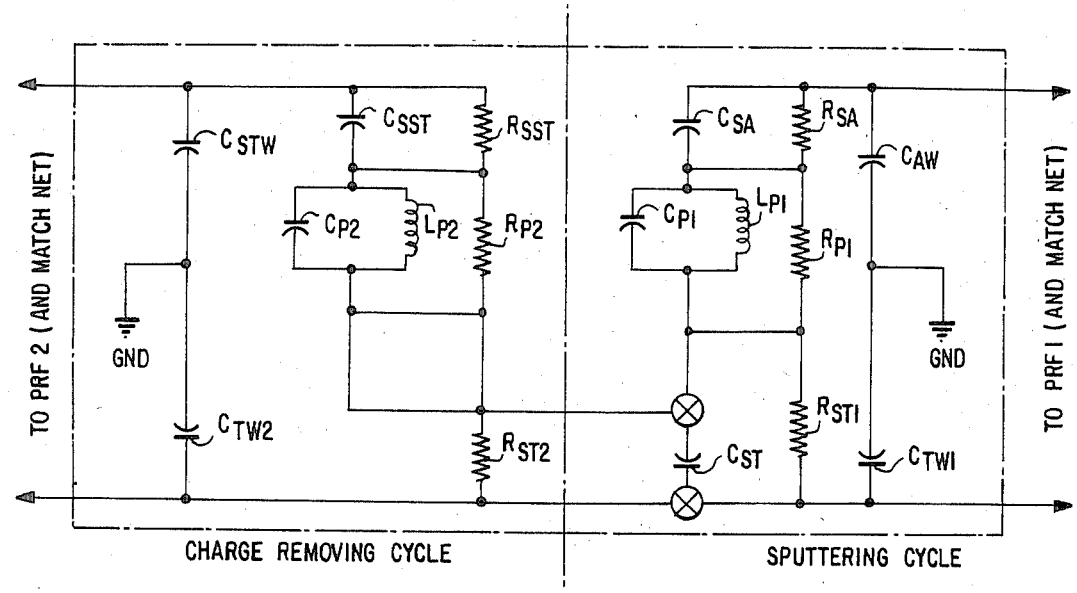
FIG. 5 shows the equivalent circuit diagram of the improved sputtering process of the present invention.

The equivalent circuit diagram of the improved sputtering process of the present invention is shown in FIG. 5.

The components of the circuit diagram of FIG. 5 are as follows:

$C_{P1}$ = plasma capacitance during the sputtering cycle;
$L_{P1}$ = plasma inductance during the sputtering cycle;
$C_{ST}$ = space charge sheath-target capacitance;
$C_{AS}$ = space charge sheath-anode capacitance;
$R_{SA} + R_{P1} + R_{stl}$ = resistive part during the sputtering cycle;
$C_{AW}$ = capacitance between the anode and the chamber
$C_{TW1}$ = capacitance between the target and the chamber wall; wall during the sputtering cycle;
$C_{P2}$ = plasma capacitance during the charge removing cycle;
$L_{P2}$ = plasma inductance during the charge removing cycle;
$C_{SST}$ = space charge sheath-secondary target capacitance;
$R_{SST} + R_{P2} + R_{ST2}$ = resistive part during the charge removing cycle;
$C_{STW}$ = capacitance between the secondary target and the chamber wall; and
$C_{TW2}$ = capacitance between the target and the chamber wall during the charge removing cycle.

The distinction between the standard RF sputtering process and the improved sputtering process of the present invention is as follows:

In standard RF sputtering
 (1) a symmetrical sinusoidal wave of 13.56 MHz frequency is applied across the target and the grounded vacuum chamber;
 (2) a negative DC offset at the target is necessary to cause sputtering;
 (3) plasma potential approximates ground potential;
 (4) charge is removed when the target becomes positive with respect to ground;
 (5) the negative DC offset at the target depends upon the target size; and
 (6) system impedance cannot be higher than the impedance due to the capacitance between the target and the chamber wall ($C_{TW} + C_d$).

In the improved sputtering process of the present invention on the other hand:
 (1) a pulsating sinusoidal wave of (a) 13.56 MHz frequency and (b) variable duty cycle from a floating type of power supply (PRF1) is applied between the target and a metallic non-grounded anode during the sputtering cycle;
 (2) the output from PRF1 forces the target to become negative with respect to the plasma potential;
 (3) during the sputtering cycle, a distinct anode cathode system causes the plasma potential to rise above the ground potential (as in the DC case) due to the electrical isolation of T and A with respect to ground.
 (4) charge is removed by forcing the target positive using a secondary target and using pulsating and short duration potential from PRF2;
 (5) a negative potential at the target during the sputtering cycle can be set to any desired value; and
 (6) because capacitances between the target and the chamber $C_{TW}$ and between the anode and the chamber walls $C_{AW}$ act in series, the system impedance increases. Also, due to reduced external capacitance, the energy efficiency increases.

In general, the present invention has, inter alia, the following features:
 (a) Glow discharge is initiated during the sputtering cycle by applying a pulsating potential across the floating, insulating target and the floating, metallic anode. Thus, the potential between the anode and the cathode can be set as desired, irrespective of the target size.

(b) During the charge removal cycle, positive charge from the target surface will be neutralized by making the target positive with respect to a secondary target.

As stated above, an important feature of the invention is the floating of the anode and the target (cathode) with respect to the chamber which is grounded. This is in contradistinction to prior art RF sputtering where, during the sputtering cycle, the cathode is negative with respect to the grounded chamber and the anode is at ground, both of these electrodes being referenced to the grounded chamber, as opposed to being electrically isolated therefrom. This new feature of the invention not only allows operation substantially equivalent to DC sputtering but also substantially increases the sputter rate and utilized power with respect to conventional RF sputtering.

The above feature could be employed even if the voltage between the anode and target were, for example, on half the time and the voltage between the auxiliary electrode (second target) and the main target were on the other half of the time. However, it is advantageous to keep the voltage on between the anode and cathode as long as possible in order to optimize the sputtering yield. A range of the duty cycle for the first power supply would typically be 60-90 percent while the duty cycle for the auxiliary electrode would typically be the remainder of 100 percent depending on the duty cycle of the main target.

The period of the waveforms in FIG. 4A will vary depending on the frequency of the power supply PRF1. Thus, if the frequency is 13.56 MHz and the duty cycle is 80 percent, the period would preferably be 0.8 times the period of one cycle of the 13.56 MHz signal while the period of the FIG. 4B signal would typically be 0.2 times the period of the one cycle.

The magnitude and duration of the voltage during the charge removal cycle must be sufficient to remove the positive charge accumulated on the target during the sputtering cycle. However, the voltage on the auxiliary electrode should not be too large or the risk of sputtering thereof becomes substantial. Thus, in order to decrease the voltage at the auxiliary electrode, the duty cycle of the second power supply must be increased. These factors together with periods of PRF1 and PRF2 can be adjusted as needed for a particular configuration.

Figure 6:
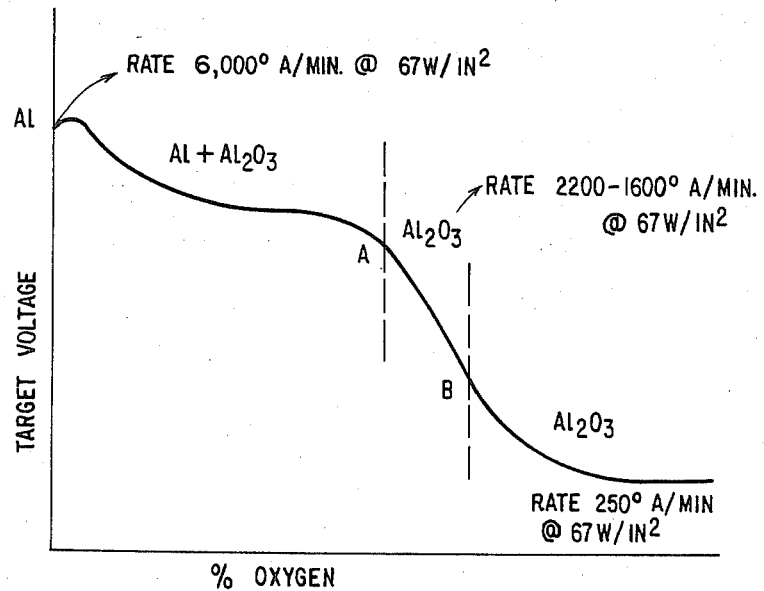
FIG. 6 is a graph showing high speed reactive sputtering of AL$_2$O$_3$ of which the present invention is capable.

The improved sputtering process of the present invention may also be employed for reactive sputtering, such as sputtering Al to form $Al_2O_3$. Due the presence of $O_2$ in the vacuum chamber, the Al target becomes oxidized. If a DC power supply is employed to sputter the Al, target arcing may occurs because ion bombardment causes positive charge buildup on at least a portion of the target. With the same basic concept of the improved sputtering process of the present invention but with lower frequency power supplies (25-75 KHz), high speed and arc face reactive sputtering of $Al_2O_3$ is possible. A high rate yield can be easily ensured by operating between points A and B of FIG. 6.

It will be obvious to those skilled in the art that many modifications may be made within the scope of the present invention without departing from the spirit thereof, and the invention includes all such modifications.

What is claimed is:

1. A sputtering device comprising:
a chamber containing a plasma;
means for biasing said chamber to a reference potential;
a target disposed in said chamber, said target being electrically isolated from said reference potential;
an auxiliary electrode disposed in the chamber and spaced from said target, said auxiliary electrode being electrically isolated from said reference potential;
an anode disposed in the chamber and electrically isolated from said reference potential;
a first power supply electrically isolated from said reference potential and connected between said target and the anode for applying, during a sputtering cycle, a series of first waveforms to the target where each of the first waveforms place the target at a negative potential with respect to the plasma such that positive ions are drawn from the plasma to sputter the target during the occurrence of each first waveform, there being a predetermined interval of time between each of the first waveforms; and
a second power supply electrically isolated from said reference potential and connected between said target and the auxiliary electrode for applying, during a charge removal cycle, a series of second waveforms to the target, said series of second waveforms respectively occurring during the predetermined intervals between said first series of waveforms where each second waveform places the target at a positive potential with respect to the plasma such that electrons are removed from the plasma to neutralize any positive charge buildup which occurs during said sputtering cycle.

2. A device as in claim 1 where said reference potential is ground.

3. A device as in claim 1 where said second series of waveforms has a duty cycle less than that of said first series of waveforms.

4. A device as in claim 1 where said first series of waveforms has a duty cycle which 60-90% and said second series of waveforms has a duty cycle which 10-40%.

5. A device as in claim 1 where said target comprises a dielectric material.

6. A device as in claim 5 where the frequency of operation of said first and second power supplies is about 13.56 MHz.

7. A device as in claim 1 including means for introducing a reactive gas into said chamber.

8. A device as in claim 7 where said gas is oxygen and said target comprises aluminum.

9. A device as in claim 1 where the frequency of operation of said first and second power supplies is 25-75 KHz.

10. A device as in claim 1 where said target comprises a substrate which is sputter-etched.

11. A device as in claim 1 including at least one substrate disposed within said chamber, said substrate being coated with the material of said target.

12. A device as in claim 11 where said substrate is disposed on said anode.

13. A device as in claim 11 where said substrate is disposed at a wall of said chamber.

14. A device as in claim 11 where said auxiliary electrode is disposed within the chamber and removed from a target material path between said target and the substrate.

15. A device as in claim 1 including a shield disposed adjacent said auxiliary electrode for capturing any material which may be sputtered from the auxiliary electrode.

16. A device as in claim 15 including means for maintaining said shield at said reference potential.

17. A sputtering method comprising the steps of:
confining a plasma within a chamber;
biasing said chamber to a reference potential;
disposing a target in said chamber and electrically isolating the target from said reference potential;
disposing an auxiliary electrode in the chamber and spacing it from the first target and electrically isolating the auxiliary electrode from said reference potential;
disposing an anode in the chamber and electrically isolating it from said reference potential;
applying, during a sputtering cycle, a series of first waveforms electrically isolated from said reference potential between the target and the anode where each of the first waveforms place the target at a negative potential with respect to the plasma such that positive ions are drawn from the plasma to sputter the target during the occurrence of each first waveform, there being a predetermined interval of time between each of the first waveforms; and
applying, during a charge removal cycle, a series of second waveforms electrically isolated from said reference potential between the target and the auxiliary electrode, said series of second waveforms respectively occurring during the predetermined intervals between said first series of waveforms where each second waveform places the target at a positive potential with respect to the plasma such that electrons are removed from the plasma to neutralize any positive charge buildup which occurs during said sputtering cycle.

18. A method as in claim 17 where said reference potential is ground.

19. A method as in claim 17 where said second series of waveforms has a duty cycle less than that of said first series of waveforms.

20. A method as in claim 17 where said target comprises a dielectric material.

21. A method as in claim 17 including introducing a reactive gas into said chamber.

22. A method as in claim 21 where reactive said gas is oxygen and said target comprises aluminum.

23. A method as in claim 17 where said target is sputter-etched.

24. A method as in claim 17 including disposing at least one substrate within said chamber and coating said substrate with the material of said target.

* * * * *